US006797607B2

(12) United States Patent
Endisch et al.

(10) Patent No.: US 6,797,607 B2
(45) Date of Patent: Sep. 28, 2004

(54) CONTACT PLANARIZATION USING NANOPOROUS SILICA MATERIALS

(75) Inventors: Denis H. Endisch, Cupertino, CA (US); James S. Drage, Fremont, CA (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 10/146,007

(22) Filed: Oct. 26, 2001

(65) Prior Publication Data

US 2002/0168876 A1 Nov. 14, 2002

Related U.S. Application Data

(62) Division of application No. 09/392,413, filed on Sep. 9, 1999, now Pat. No. 6,589,889.

(51) Int. Cl.$^7$ ........................................... H01L 21/4763
(52) U.S. Cl. ..................... 438/623; 438/758; 438/780; 438/781; 438/782; 438/789; 438/790
(58) Field of Search .................. 438/780–782, 438/789, 790, 758, 623; 427/96, 422, 427

(56) References Cited

U.S. PATENT DOCUMENTS

| | | | | |
|---|---|---|---|---|
| 4,301,099 A | | 11/1981 | Broeksema et al. ........... | 264/25 |
| 5,434,107 A | * | 7/1995 | Paranjpe ..................... | 438/760 |
| 5,531,183 A | * | 7/1996 | Sivaramakrishnam et al. ........................ | 117/93 |
| 5,736,424 A | * | 4/1998 | Prybyla et al. .............. | 438/780 |
| 5,895,263 A | | 4/1999 | Carter et al. ................ | 438/624 |
| 5,947,027 A | | 9/1999 | Burgin et al. ............... | 101/474 |
| 6,022,812 A | | 2/2000 | Smith et al. ................ | 438/761 |
| 6,037,275 A | | 3/2000 | Wu et al. .................... | 438/780 |
| 6,037,277 A | * | 3/2000 | Masakara et al. ........... | 438/787 |
| 6,062,133 A | | 5/2000 | Blalock ....................... | 100/211 |
| 6,063,714 A | * | 5/2000 | Smith et al. ................ | 438/778 |
| 6,121,130 A | | 9/2000 | Chua et al. ................. | 438/623 |
| 6,132,814 A | * | 10/2000 | Liversay et al. ............ | 427/542 |
| 6,171,945 B1 | * | 1/2001 | Mandal et al. .............. | 438/622 |
| 6,197,913 B1 | * | 3/2001 | Zhong ........................ | 528/31 |
| 6,204,201 B1 | * | 3/2001 | Ross ........................... | 438/778 |
| 6,318,124 B1 | * | 11/2001 | Rutherford et al. ......... | 65/60.8 |
| 6,380,105 B1 | * | 4/2002 | Smith et al. ................ | 438/778 |
| 6,407,006 B1 | * | 6/2002 | Levert et al. ............... | 438/761 |
| 6,444,478 B1 | * | 9/2002 | Basceri et al. ................ | 438/3 |
| 2001/0036749 A1 | * | 11/2001 | Levert et al. ............... | 438/758 |

FOREIGN PATENT DOCUMENTS

| | | |
|---|---|---|
| EP | 0 721 208 A2 | 12/1995 |
| WO | WO 95/11521 | 4/1995 |
| WO | WO 98/48453 | 10/1998 |
| WO | WO 98/53487 | 11/1998 |

OTHER PUBLICATIONS

Patent Abstracts of Japan, Publication No. 02125436, Publication Date May 14, 1990, NEC Kagoshima Ltd., Nakano Masahiro.
Patent Abstracts of Japan, Publication No. 58105444, Publication Date Jun. 23, 1983, Toppan Printing Co., Ltd., Saito Akihide.
Mezza, et al., "Sol–Gel Derived Porous Silica Films", Journal of Non–Crystalline Solids, 1999, V243, N1 (Jan. 1), pp. 75–79.
"Mold–Assisted Nanolithography: A Process for Reliable Pattern Replicatiaon", Jan Haisma, et al., J. Vac. Sci. Technol. B 14(6), Nov./Dec. 1996.
"Embossed Gratings in Sol–Gel Waveguides: Pre–Emboss Heat Treatment Effects", Ronald L Roncone, et al., Journal of Non–Crystalline Solids 128 (1991) 111–117, North–Holland.
"Nano–Compact Disks With 400 Gbit/in$^2$ Storage Density Fabricated Using Nanoimprint Lithography and Read with Proximal Probe", Peter R. Krauss, et al., 1997 American Insti. of Physics.
"Fine Patterning of Thin Sol–Gel Films", Herbert Krug, et al., Journal of Non–Crystalline Solids 147 & 148 (1992), 447–450, North–Holland.
"Device for Planarizing Structured Surfaces", IBM Technical Disclosure Bulletin, vol. 32, No. 5A, Oct. 1989.
Spin Coating by Larson, Ronald G., et al., from the publication Liquid Film Coating, edited by S.F. Kisler, et al., published in 1997 by Chapman & Hall.

* cited by examiner

Primary Examiner—Hsien Ming Lee
(74) Attorney, Agent, or Firm—Roberts & Roberts, LLP

(57) ABSTRACT

A process for forming a substantially planarized nanoporous dielectric silica coating on a substrate suitable for preparing a semiconductor device, and semiconductor devices produced by the methods of the invention. The process includes the steps of applying a composition that includes at least one silicon-based dielectric precursor to a substrate, and then, (a) gelling or aging the applied coating,
(b) contacting the coating with a planarization object with sufficient pressure to transfer a planar impression to the coating without substantially impairing formation of desired nanometer-scale pore structure,
(c) separating the planarized coating from the planarization object,
(d) curing said planarized coating;

wherein steps (a)–(d) are conducted in any one of the following sequences:

(a), (b), (c) and (d);
(a), (d), (b) and (c);
(b), (a), (d) and (c); and
(b), (c), (a) and (d).

34 Claims, No Drawings

CONTACT PLANARIZATION USING NANOPOROUS SILICA MATERIALS

CROSS REFERENCE TO RELATED APPLICATION

This application is a division of U.S. patent application Ser. No. 09/392,413, filed Sep. 9, 1999, now U.S. Pat. No. 6,589,889.

FIELD OF THE INVENTION

The present invention relates to semiconductor devices, including integrated circuit ("IC") devices. More particularly, it relates to a method for planarizing and/or patterning surfaces of semiconductor devices that contain silica dielectric coatings and particularly nanoporous silica dielectric coatings, as well as to semiconductor devices produced by these methods.

BACKGROUND OF THE INVENTION

Processes used for the fabrication of semiconductor devices almost invariably produce surfaces which significantly deviate from a planar configuration. With the trend toward greater large scale integration, this problem is expected to increase. For instance, the production of integrated circuits typically requires multiple layers to be formed sequentially on a semiconductor substrate. Many of these layers are patterned by selective deposition or selective removal of particular regions of each such layer. It is well known that small deviations from the planar condition in underlying layers become more pronounced with the addition of multiple additional layers of semiconductor and circuit features. Non-planar substrate surfaces can cause many problems that adversely impact the yield of finished products. For example, variations in interlevel dielectric thickness can result in failure to open vias, poor adhesion to underlying materials, step coverage, undesirable bends or turns in conductive metal layers, as well as "depth-of-focus" problems for optical lithography.

In order to effectively fabricate multiple layers of interconnects it has become necessary to globally planarize the surface of certain layers during the multi-step process. Planarizing smoothes or levels the topography of microelectronic device layers in order to properly pattern the increasingly complex integrated circuits. IC features produced using optical or other lithographic techniques require regional and global dielectric planarization where the lithographic depth of focus is extremely limited, i.e., at 0.35 $\mu$m and below. As used herein, the term "local planarization" refers to a condition wherein the film is planar or flat over a distance of 0 to about 5 linear micrometers. "Regional planarization" refers to a condition wherein the film is planar or flat over a distance of about 5 to about 50 linear micrometers. "Global planarization" refers to a condition wherein the film is planar or flat over a distance of about 50 to about 1000 linear micrometers. Without sufficient regional and global planarization, the lack of depth of focus will manifest itself as a limited lithographic processing window.

In addition, as IC feature sizes approach 0.25 $\mu$m and below, problems with interconnect RC delay, power consumption and signal cross-talk have become increasingly difficult to resolve. The integration of low dielectric constant materials for interlevel dielectric (ILD) and intermetal dielectric (IMD) applications, is helping to solve these problems. One type of such low dielectric constant materials are nanoporous films prepared from silica, i.e., silicon-based materials. When air, with a dielectric constant of 1, is introduced into a suitable silica material having a nanometer-scale pore structure, dielectric films with relatively low dielectric constants ("k"), e.g., 3.8 or less, can be prepared on substrates, such as silicon wafers, suitable for fabricating integrated circuits. Thus, it is now important for the fabrication of the latest types of semiconductor devices, including integrated circuits, to provide methods for planarizing surfaces coated with nanoporous silica dielectric films.

One previously employed method of planarization is the etch-back technique. In that process, a material, i.e., a planarizing material, is deposited on a surface in a manner adapted to form a surface relatively free of topography. If the device layer and the overlying material layer have approximately the same etch rate, etching proceeds through the planarizing material and into the device layer with the surface configuration of the planarizing layer being transferred to the device material surface. Although this technique has been adequate for some applications where a modest degree of planarity is required, present planarizing materials and present methods for depositing the planarizing material are often inadequate to furnish the necessary planar surface for demanding applications such as in submicron device fabrication.

The degree of planarization is defined as the difference between the depth of the topography on the device surface $h_t$, and the vertical distance between a high point and a low point on the overlying material surface $h_d$, divided by the depth of the topography on the device surface $h_t$:

$$\frac{h_t - h_d}{h_t}$$

The degree of planarization, in percent, is $$\frac{h_t - h_d}{h_t} \times 100$$

Generally, for typical device configurations, planarization using the etch-back technique has not been better than approximately 55% as calculated by the method described above for features greater than 300 microns in width. The low degree planarization achieved by this technique is attributed to a lack of planarity in the planarizing material. Thus, for elongated gap-type features greater than 300 microns in width and 0.5 microns in depth, the usefulness of an etch-back technique has been limited.

U.S. Pat. No. 5,736,424, incorporated herein by reference in its entirety, describes a method for planarizing surfaces of substrates, such as semiconductor materials, by adding a pressing step to an etch-back process. In this reference, an optically flat surface is impressed on a curable viscous polymer coating on the substrate surface in need of planarization, followed by polymerization of the coating. The polymer is selected to etch at the same rate as the surface in need of planarization, and the polymer coating is etched down to the substrate, which is planarized by the process. While an improved planarization is claimed, apparently by starting the etch-back with a flatter surface, an added process step and complexity is required. In addition, this reference fails to provide a solution for planarizing substrates coated with nanoporous dielectric films, since by their nature, such low density films cannot be etched at the same rate as the underlying substrate.

Chemical mechanical polishing (CMP) is another known method that has been effectively used in the art to globally planarize the entire surface of dielectric layers. According to this method, a grainy chemical composition or slurry is applied to a polishing pad and is used to polish a surface until a desired degree of planarity is achieved. CMP can rapidly remove elevated topographical features without significantly thinning flat areas. However, CMP does require a high degree of process control to obtain the desired results.

Dielectric films formed of organic polymers, such as polyarylene ether and/or fluorinated polyarylene ether polymers, have been planarized by applying CMP to a partially cured film, followed by a final curing, as described in co-owned U.S. application Ser. No. 09/023,415, filed on Feb. 13, 1998, the disclosure of which is incorporated by reference herein in its entirety. However, this reference fails to disclose how to planarize a silicon-based nanoporous dielectric material on the surface of a substrate.

For all of these reasons, there remains a need in the art for improved methods for achieving the planarization of substrates bearing nanoporous silica dielectric type materials.

SUMMARY OF THE INVENTION

In order to solve the above mentioned problems and to provide other improvements, the invention provides novel methods for effectively producing planarized nanoporous silica dielectric films with a low dielectric constant ("k"), e., typically ranging from about 1.5 to about 3.8, and compositions produced by these methods, having surfaces that do not deviate from a planar topography by more than $0.35\mu$, and having a degree of planarization of at least 55%, or greater.

Nanoporous silica films can be fabricated by using a mixture of a solvent composition and a silicon-based dielectric precursor, e.g., a liquid material suitable for use as a spin-on-glass ("SOG") material, which is deposited onto a wafer by conventional methods of spin-coating, dip-coating, etc., and/or by chemical vapor deposition and related methods, as mentioned in detail above. The silica precursor is polymerized by chemical and/or thermal methods until it forms a gel. Further processing by solvent exchange, heating, electron beam, ion beam, ultraviolet radiation, ionizing radiation and/or other similar methods that result in curing and hardening of the applied film.

At an appropriate point in the process, the applied film is contacted with a planarization object, e., an object with a flat surface, or other type of surface suitable for the purpose. The planarization object and film are brought together with a force sufficient to effectively flatten the surface of the film, and thereafter the planarization object is separated from contact with the dielectric film, and any remaining process steps are conducted to produce a hardened nanoporous dielectric silica film.

Thus, the processes and compositions of the invention provide a substantially planarized nanoporous dielectric silica coating on a substrate formed by a process that includes: applying a composition that comprises a silicon-based precursor onto a substrate to form a coating on said substrate, and conducting the following steps:

(a) gelling or aging the applied coating, (b) contacting the coating with a planarization object with sufficient pressure to transfer an impression of the object to the coating without substantially impairing formation of desired nanometer-scale pore structure, (c) separating the planarized coating from the planarization object, (d) curing said planarized coating;

wherein steps (a)–(d) are conducted in a sequence selected from the group consisting of (a), (b), (c) and (d);

(a), (d), (b) and (c);

(b), (a), (d) and (c);

(b), (a), (c) and (d); and (b), (c), (a) and (d);

The processes and compositions of the invention also provide a nanoporous dielectric silica coating on a substrate with a pattern impressed thereon by a process that includes: coating a substrate with a composition including a precursor for forming a nanoporous dielectric film, contacting the coating with a desired patterned surface with a pressure and for a time period sufficient in impress the pattern on said coating, and then separating the patterned surface from the coating. Optionally, the coating is aged or gelled before, during or after being contacted with the patterned surface, and, as noted above, the patterned surface can also be planar, or include multiple planar regions and/or other desirable features. The treated film can also be cured before, during or after pressing, using heat or any other art-known curing methods. If the curing is accomplished by heating, the heating can be applied by any art-standard devices, including a hot plate, a furnace, and even within the press, by applying heat to the film. Simply by way of example, for curing in a furnace, the heat can be applied at a temperature ranging from about 350° C. to about 600° C. for a time period ranging from about 30 sec to about 5 minutes.

In a further optional feature, the coating to be impressed with one or more planar surfaces and/or other useful topography and can include dielectric coatings, e.g., silicon-based dielectric coatings, which are not nanoporous. Thus, dielectric coatings on a substrate that are not foamed or porous can also optionally be planarized or impressed by the methods described herein.

Processes for producing the above-described nanoporous dielectric silica films, as well as integrated circuit devices incorporating these improved films, are also provided.

DETAILED DESCRIPTION OF THE PREFERRED EMBODIMENT

Accordingly, methods for planarizing substrates and devices are provided, together with devices fabricated by the inventive methods.

In order to better appreciate the scope of the invention, it should be understood that unless the "$SiO_2$" functional group is specifically mentioned when the term "silica" is employed, the term "silica" as used herein, for example, with reference to nanoporous dielectric films, is intended to refer to dielectric films prepared by the inventive methods from an organic or inorganic glass base material, e.g., any suitable starting material containing one or more silicon-based dielectric precursors. It should also be understood that the use of singular terms herein is not intended to be so limited, but, where appropriate, also encompasses the plural, e.g., exemplary processes of the invention may be described as applying to and producing a "film" but it is intended that multiple films can be produced by the described, exemplified and claimed processes, as desired. Additionally, the term "aging" refers to the gelling or polymerization, of the combined composition on the substrate after deposition, induced, e.g., by exposure to water and/or an acid or base catalyst. The term "curing" refers to the hardening and drying of the film, after gelling, typically by the application of heat, although any other art-known form of curing may be employed, e.g., by the application of energy in the form of an electron beam, ultraviolet radiation, and the like.

The terms, "agent" or "agents" herein should be considered to be synonymous with the terms, "reagent" or "reagents," unless otherwise indicated.

Further, although the description provided herein generally describes processes employed for preparing and planarizing foamed dielectric materials, such as the exemplified nanoporous silica films, the artisan will readily appreciate that the instantly provided methods and compositions are optionally applied to other substrate surfaces, and that other planarizing materials can be employed, including, for example, nonporous silica dielectric films.

In addition, the terms, "flat" or "planar" are intended to be equivalent, unless other stated, when used herein. When these terms are employed with reference to a dielectric film produced by the inventive methods, it is to indicate that the film has the desired degree of planarization.

Of course, it will be appreciated that the exact nature of any surface features impressed or pressed onto a nanoporous silica-type dielectric film will depend on the device requirements and fabrication needs for the desired resulting integrated circuit device. Thus, any type of pattern may be impressed upon a nanoporous silica-type dielectric film according to the invention, including multiple planar regions, vias, trenches and the like, for convenience in fabrication. Thus, absent any statement to the contrary, reference herein to a "planarization object" and/or "planarization surface" is intended to encompass objects or surfaces bearing any such useful pattern to be impressed on a nanoporous dielectric silica film.

In addition, any suitable number of types of art-known objects can be used as planarization objects to apply a patterned, i.e., including a flat or planar impression, on a plastic or malleable surface, including, for example, objects having at least one flat surface, such as optical flats and the like, as well as objects possessing a contact surface that is curved in one of its dimensions, including drums or roller type objects, as well as objects having more complex curved surfaces. Thus, for planarization objects having curved surfaces, it will be appreciated that contact between such a curved surface and the surface to be treated will be achieved with a rolling motion or rotating motion.

As summarized in the "Background of the Invention" above, a number of methods for the preparation of nanoporous silica films on substrates are known to the art. In addition, a number of methods for planarizing substrates for the production of integrated circuit ("IC") devices, are also known. However, it is believed that prior to the present invention, the successful application of the planarization methods to nanoporous dielectric silica films, as described herein, has not been reported.

Broadly, a substrate coating can be contacted with a planarization object before, during or after the aging and/or curing of the applied nanoporous silica dielectric film.

It is simply required that the applied film or coating be sufficiently plastic or pliable to accept the planar impression, without damaging or preventing formation of the nanometer-scale pore structure.

It will also be appreciated that the planarization processes provided by the invention can optionally provide a nanoporous dielectric silica film having a sealed film surface, which can provide the added benefits of improved mechanical properties, e.g., increased cohesive strength, modulus, or adhesion, relative to nonplanarized films, and optionally can obviate a need for post-curing surface modification to enhance surface hydrophobic properties.

Methods for Preparing Planarized Nanoporous Dielectric Films

Typically, nanoporous silica dielectric films are prepared from a suitable silicon-based dielectric precursor, e.g., an S.O.G. material blended with one or more solvents and/or other components. The silicon-based dielectric precursor is applied to a surface to be planarized by any art-known method, e.g., including, but not limited to, the art-known methods for application of liquid precursors by spin-coating, dip coating, brushing, rolling, spraying and/or by chemical vapor deposition. Prior to application of the base materials to form the nanoporous silica film, the substrate surface is optionally prepared for coating by standard, art-known cleaning methods.

After the silicon-based dielectric precursor is applied to the substrate surface, the coated surface is contacted with a planarization object. Preferably, the contact surface of the object is fabricated or coated with a non-stick release material, e.g., Teflon™ or its functional equivalent. As noted above, the artisan will also appreciate that the contact surface, including the described non-stick release material, need not be optically flat, but can also be patterned in order to transfer or imprint any desired topography onto the impressed surface, in the form of multiple planar regions, or other desirable features.

Optionally, the non-stick surface is in the form of a selectively permeable membrane, e.g., Gortex™ that is able to pass vapor phase reagents, dissolved gases, reaction product gases, and/or solvents into or away from the surface being planarized. Advantageously, such an optional selectively permeable membrane can prevent the formation of bubble artifacts on or within the planarized surface. Such a selectively permeable non-stick surface can also optionally be replaced or undercoated with a material that is selected to absorb and/or adsorb gases or vapors that might lead to undesirable formation of bubbles on the pressed surface. In another option, the contact surface incorporates one or more openings or passages to allow for venting of any excess vapors or gases.

Once the surface of the treated dielectric film has assumed the desired shape, the planarization object and the film are then separated, although in certain embodiments the non-stick release material can be left on the substrate coating for an additional time period, to allow more time for aging or gelation, to allow for further film processing and/or to protect the newly planarized surface during further processing steps.

The processes and compositions of the invention are provided in greater detail, as follows.

Silicon-Based Precursors for Dielectric Films

Preferred silicon-based dielectric precursors include organosilanes, including, for example, alkoxysilanes according to Formula I, as taught, e.g., by co-owned U.S. application Ser. No. 09/054,262, filed on Apr. 3, 1998, the disclosure of which is incorporated by reference herein in its entirety.

Formula I

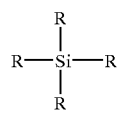

In one embodiment, Formula I is an alkoxysilane wherein at least 2 of the R groups are independently $C_1$ to $C_4$ alkoxy groups, and the balance, if any, are independently selected from the group consisting of hydrogen, alkyl, phenyl, halogen, substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane. As exemplified below, a partially hydrolyzed and partially condensed fluid alkoxysilane composition can be employed. Such a precursor is commercially available as Nanoglass™ K2.2 (AlliedSignal, Inc., Advanced Micoelectronic Materials).

In a further option, for instance, especially when the precursor is applied to the substrate by chemical vapor deposition, e.g., as taught by co-owned patent applicatiion Ser. No. 09/111,083, filed on Jul. 7, 1998, and incorporated by reference herein in its entirety, the precursor can also be an alkylalkoxysilane as described by Formula I, but instead, at least 2 of the R groups are independently $C_1$ to $C_4$ alkylalkoxy groups wherein the alkyl moiety is $C_1$ to $C_4$ alkyl and the alkoxy moiety is $C_1$ to $C_6$ alkoxy, or ether-alkoxy groups; and the balance, if any, are independently selected from the group consisting of hydrogen, alkyl, phenyl, halogen, substituted phenyl. In one preferred embodiment each R is methoxy, ethoxy or propoxy. In another preferred embodiment at least two R groups are alkylalkoxy groups wherein the alkyl moiety is $C_1$ to $C_4$ alkyl and the alkoxy moiety is $C_1$ to $C_6$ alkoxy. In yet another preferred embodiment for a vapor phase precursor, at least two R groups are ether-alkoxy groups of the formula ($C_1$ to $C_6$ alkoxy)$_n$ wherein n is 2 to 6.

Application Ser. No. 09/111,083, mentioned above, also teaches that preferred silica precursors for chemical vapor deposition include, for example, any or a combination of alkoxysilanes such as tetraethoxysilane, tetrapropoxysilane, tetraisopropoxysilane, tetra(methoxyethoxy)silane, tetra(methoxyethoxyethoxy)silane which have four groups which may be hydrolyzed and than condensed to produce silica, alkylalkoxysilanes such as methyltriethoxysilane silane, arylalkoxysilanes such as phenyltriethoxysilane and precursors such as triethoxysilane which yield SiH functionality to the film. Tetrakis(methoxyethoxyethoxy)silane, tetrakis(ethoxyethoxy)silane, tetrakis(butoxyethoxyethoxy) silane, tetrakis(2-ethylthoxy)silane, tetrakis (methoxyethoxy)silane, and tetrakis(methoxypropoxy) silane are particularly useful for the invention. Additionally, partially hydrolyzed, condensed or polymerized derivatives of these species can be used in this invention. Other precursors of utility to this invention could include precursors which can be thermally or photolytically crosslinked. In general, the precursors can be gases, liquids or solids at room temperature.

In other preferred embodiments, the silicon-based dielectric precursor(s) can also be selected from one or more additional polymers, as taught by co-owned U.S. application serial No. 60/098,515, filed on Aug. 31, 1998, and incorporated by reference herein in its entirety, including, but not limited to, a silsesquioxane polymer, hydrogensiloxanes which have the formula [(HSiO$_{1.5}$)$_x$O$_y$]$_n$, hydrogensilsesquioxanes which have the formula (HSiO$_{1.5}$)$_n$, and hydroorganosiloxanes which have the formulae [(HSiO$_{1.5}$)$_x$O$_y$ (RSiO$_{1.5}$)$_z$]$_n$, [(HSiO$_{1.5}$)$_x$(RSiO$_{1.5}$)$_y$]$_n$ and [(HSiO$_{1.5}$)$_x$O$_y$ (RSiO$_{1.5}$)$_z$]$_n$. In each of these polymer formulae, x is about 6 to about 20, y is 1 to about 3, z is about 6 to about 20, n ranges from 1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Thus, useful silicon-based polymers nonexclusively include hydrogensiloxane, hydrogensilsesquioxane, hydrogenmethylsiloxane, hydrogenethylsiloxane, hydrogenpropylsiloxane, hydrogenbutylsiloxane, hydrogentertbutylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof, as well as others too numerous to mention.

In further preferred embodiments, as taught by co-owned U.S. serial No. 60/098,068, filed on Aug. 27, 1998, incorporated by reference herein in its entirety, the silica precursor(s) can also be formed by reacting certain multi-functional silane reagents prior to application of the reaction product to a substrate. For example, such precursors are formed by reacting a multifunctional, e.g., a trifunctional silane precursor, with a tetrafunctional silane precursor and then depositing the reaction product on a substrate.

Desirable multi-functional alkoxysilanes are selected from the group having the formula $$A_n\text{---SiH}_m \qquad \text{Formula II}$$

wherein each A is independently an alkoxy (O—R) wherein R is an organic moiety independently selected from the group consisting of an alkyl and an aryl, and wherein n is an integer ranging from 1 to 3; m is an integer ranging from 1 to 3 and the sum of m and n is 4.

A tetrafunctional alkoxylsilane employed in the processes of the invention preferably has a formula of $$A_4\text{---Si} \qquad \text{Formula III}$$

wherein each A is independently an alkoxy (O—R) and R is an organic moiety independently selected from the group consisting of an alkyl and an aryl, In a further aspect of the invention, the alkoxysilane compounds described above may be replaced, in whole or in part, by compounds with acetoxy and/or halogen-based leaving groups. For example, the precursor compound may be an acetoxy (CH$_3$—CO—O—) such as an acetoxy-silane compound and/or a halogenated compound, e.g., a halogenated silane compound and/or combinations thereof. For the halogenated precursors the halogen is, e.g., Cl, Br, I and in certain aspects, will optionally include F.

Generally for the above-described base materials or dielectric film precursors, the polymer component is preferably present in an amount of from about 10% to about 50% by weight of the composition. A more preferred range is from about 15% to about 30% and most preferably from about 17% to about 25% by weight of the composition. Preferred siloxane materials are commercially available, for example, from AlliedSignal Inc. under the tradename Accuglas®.

Substrates

Broadly speaking, a "substrate" as described herein includes any suitable composition formed before a nanoporous silica film of the invention is applied to and/or formed on that composition. For example, a substrate is typically a silicon wafer suitable for producing an integrated circuit or related device, and the base material from which the nanoporous silica film is formed is applied onto the substrate by conventional methods, e.g., including, but not limited to, the art-known methods of spin-coating, dip coating, brushing, rolling, spraying and/or chemical vapor deposition, or other suitable method or methods. Prior to application of the base materials to form the nanoporous silica film, the substrate surface is optionally prepared for coating by standard, art-known cleaning methods.

Suitable substrates for the present invention non-exclusively include semiconductor materials such as gallium arsenide ("GaAs"), silicon and compositions containing silicon such as crystalline silicon, polysilicon, amorphous silicon, epitaxial silicon, and silicon dioxide ("$SiO_2$") and mixtures thereof. The substrate is typically prepared or obtained, prior to further processing, in the form of a polished wafer. On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit.

Such are typically closely separated from one another at distances of about 20 micrometers or less, preferably 1 micrometer or less, and more preferably from about 0.05 to about 1 micrometer. Other optional features of the surface of a suitable substrate include an oxide layer, such as an oxide layer formed by heating a silicon wafer in air, or more preferably, an $SiO_2$ oxide layer formed by chemical vapor deposition of such art-recognized materials as, e.g., plasma enhanced tetraethoxysilane ("PETEOS") silane oxide and combinations thereof, as well as one or more previously formed nanoporous silica dielectric films.

The nanoporous silica films of the invention can be applied so as to cover and/or lie between such optional electronic surface features, e.g., circuit elements and/or conduction pathways that may have been previously formed features of the substrate. Such optional substrate features can also be applied above the nanoporous silica film of the invention in at least one additional layer, so that the low dielectric film serves to insulate one or more, or a plurality of electrically and/or electronically functional layers of the resulting integrated circuit. Thus, a substrate according to the invention optionally includes a silicon material that is formed over or adjacent to a nanoporous silica film of the invention, during the manufacture of a multilayer and/or multicomponent integrated circuit.

In a further option, a substrate bearing a nanoporous silica film or films according to the invention can be further covered with additional layers.

A. Applying Silicon-Based Dielectric Precursor to a Substrate

Nanoporous silica dielectric films are prepared by coating a silicon-based dielectric precursor onto a substrate or substrates using methods based upon those described in detail in, for example, in co-owned U.S. application Ser. No. 09/054,262, filed on Apr. 3, 1998, the disclosure of which is incorporated by reference herein in its entirety. Modifications to methods described in U.S. application Ser. No. 09/054,262, for example, include those that are those optionally required by the need for contacting the film material with a planarization object.

Typically, a nanoporous silica dielectric film is prepared by forming a reaction product of, for example, at least one alkoxysilane, e.g., as described by Formula I, supra, a solvent composition, optional water and an optional catalytic amount of an acid or base. Water is included to provide a medium for hydrolyzing the alkoxysilane. Preferably the solvent composition comprises at least one relatively high volatility solvent and at least one a relatively low volatility solvent.

This reaction product is applied onto a substrate optionally having raised lines e.g., as described supra. The high volatility solvent evaporates during and immediately after deposition of the reaction product. The reaction product is hydrolyzed and condensed until it forms a gel layer. For planarization, for example, a flat surface can be contacted with the gel layer after the high volatility solvent has evaporated, leaving behind a viscous coating, but before the curing or aging process has progressed sufficiently to render the coating non-pliable.

For purposes of the invention, "a relatively high volatility solvent" is one which evaporates at a temperature below, preferably significantly below that of the relatively low volatility solvent. The relatively high volatility solvent preferably has a boiling point of about 120° C. or less, preferably about 100° C. or less. Suitable high volatility solvents nonexclusively include methanol, ethanol, n-propanol, isopropanol, n-butanol and mixtures thereof. Other relatively high volatility solvent compositions which are compatible with the other ingredients can be readily determined by those skilled in the art.

For purposes of the invention, "a relatively low volatility solvent" composition is one which evaporates at a temperature above, preferably significantly above, that of the relatively high volatility solvent. The relatively low volatility solvent composition preferably has a boiling point of about 175° C. or higher, more preferably about 200° C. or higher. Suitable low volatility solvent compositions nonexclusively include alcohols and polyols including glycols such as ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4,1,4-butanediol, 2-methyl-1,3-propanediol, tetraethylene glycol, triethylene glycol monomethyl ether, glycerol and mixtures thereof. Other relatively low volatility solvent compositions which are compatible with the other ingredients can be readily determined by those skilled in the art.

In another option, acid catalysts can be employed. Suitable acids are nitric acid and compatible organic acids which are volatile, i.e. which evaporate from the resulting reaction product under the process operating conditions, and which do not introduce impurities into the reaction product.

The silane component, e.g., alkoxysilane, is preferably present in an amount of from about 3% to about 50% by weight of the overall blend. A more preferred range is from about 5% to about 45% and most preferably from about 10% to about 40%.

The solvent component is preferably present in an amount of from about 20% to about 90% by weight of the overall blend. A more preferred range is from about 30% to about 70% and most preferably from about 40% to about 60%. The greater the percentage of high volatility solvent employed, the thinner is the resulting film. The greater the percentage of low volatility solvent employed, the greater is the resulting porosity The mole ratio of water to the silane component is preferably from about 0 to about 50. A more preferred range is from about 0.1 to about 10 and most preferably from about 0.5 to about 1.5. The acid is present in a catalytic amount which can be readily determined by those skilled in the art. Preferably the molar ratio of acid to silane ranges from about 0 to about 0.2, more preferably from about 0.001 to about 0.05, and most preferably from about 0.005 to about 0.02.

The prepared silicon-based dielectric precursor is then coated on a substrate. The layer is relatively uniformly applied. While the substrate can be any art-known material, e.g., as described supra, typical substrates are polished semiconductor wafers, optionally having one or more semiconductor components previously fabricated on the surface.

The solvent, usually the higher volatility solvent is then at least partially evaporated from the coating. The more volatile solvent evaporates over a period of seconds or minutes. At this point, the film is a viscous liquid of the silica precursors and the less volatile solvent. Slightly elevated temperatures may optionally be employed to accelerate this step. Such temperatures may range from about 20° C. to about 80° C., preferably range from about 20° C. to about 50° C. and more range from about 20° C. to about 35° C.

The coated substrate is then placed in a sealed chamber and is rapidly evacuated to a vacuum. In the preferred embodiment, the pressure of the evacuated chamber ranges from about 0.001 torr to about 0.1 torr, or greater. In an alternative embodiment, the chamber pressure may range from about 0.001 torr to about 760 torr, or greater. Typically, the pressure is about 250 torr. Then the coating is sequentially exposed to both a water vapor and a base vapor, either simultaneously or sequentially. For purposes of this invention, a base vapor includes gaseous bases. Preferably the coating is first exposed to a water vapor and then exposed to a base vapor, however, in an alternate embodiment, the coating may first be exposed to a base vapor and then a water vapor. The first of the two exposures is conducted such that thereafter the pressure in the chamber remains at sub-atmospheric pressure. The second exposure may be conducted at atmospheric pressure, sub-atmospheric pressure or super-atmospheric pressure.

In one preferred embodiment, after the coated substrate is placed in the sealed chamber and the chamber evacuated to a vacuum, a valve is opened to a reservoir of water, and water vapor quickly fills the chamber. The partial pressure of water vapor, $P_{H2O}$ is controlled by the length of time that the valve is open and the temperature at which the liquid water reservoir is maintained. Because of the low vapor pressure of water, the chamber pressure after water addition is much less than ambient. The pressure rise that occurs in the chamber during the water vapor addition is a direct measure of the water vapor partial pressure. In the preferred embodiment, the pressure of the evacuated chamber after the water vapor exposure ranges from about 0.1 torr to about 150 torr, preferably about 1 torr to about 40 torr and more preferably from about 5 torr to about 20 torr. In the preferred embodiment, the temperature of the water during the exposure ranges from about 10° C. to about 60° C., preferably from about 15° C. to about 50° C., and more preferably from about 20° C. to about 40° C. In the preferred embodiment, the temperature in the chamber after water exposure ranges from about 10° C. to about 50° C., preferably from about 15° C. to about 40° C., and more preferably from about 20° C. to about 40° C.

After water vapor addition, a base vapor is dosed into the chamber. The chamber pressure after base dosing may be at, above or below atmospheric pressure. If the pressure is above atmospheric, the chamber must be designed to resist the total system pressure. As with water vapor, the partial pressure of the base is known directly from the pressure rise during base dosing. Because the chamber only contains base and water vapor, except for trace amounts of atmospheric gas left from the initial chamber pumpdown, the base and water diffusion rates are much faster than the case when evacuation is not conducted, resulting in greatly increased polymerization rates, decreased process time per coated substrate, and greater uniformity across the coated surface. Since the base and water vapor are added separately, their partial pressures are easily measured and there is very little waste. Only the vapor above the wafer need be removed upon deposition. The order of addition of water and base may be reversed but the addition of water before the base is preferred because of its lower vapor pressure. In the preferred embodiment, the pressure of the evacuated chamber after the base vapor exposure ranges from about 100 torr to about 2,000 torr, preferably about 400 torr to about 1,000 torr and more preferably from about 600 torr to about 800 torr. In the preferred embodiment, the temperature of the base during the exposure ranges from about 10° C. to about 60° C., preferably from about 15° C. to about 40° C., and more preferably from about 20° C. to about 30° C. In the preferred embodiment, the temperature in the chamber after base exposure ranges from about 10° C. to about 50° C., preferably from about 15° C. to about 40° C., and more preferably from about 20° C. to about 40° C.

Suitable bases (i.e., alkaline regents) for use in the base vapor nonexclusively include ammonia and non-volatile amines, such as primary, secondary and tertiary alkyl amines, aryl amines, alcohol amines and mixtures thereof which have a boiling point of about 200° C. or less, preferably 100° C. or less and more preferably 25° C. or less. Preferred amines do not require an atmosphere for aging, i.e., while the film is being impressed with a flat surface, and include, for example, monoethanol amine, tetraethylenepentamine, 2-(aminoethylamino)ethanol, 3-aminopropyltriethoxy silane, 3-amino-1,2-propanediol, 3-(diethylamino)-1,2-propanediol, n-(2-aminoethyl)-3-aminopropyl-trimethoxy silane, 3-aminopropyl-trimethoxy silane. Additional amines that are useful for the processes of the invention include, e.g., methylamine, dimethylamine, trimethylamine, n-butylamine, n-propylamine, tetramethyl ammonium hydroxide, piperidine and 2-methoxyethylamine. The ability of an amine to accept a proton in water is measured in terms of the basic constant $K_b$, and $pK_b = -\log K_b$. In the preferred embodiment, the $pK_b$ of the base may range from about less than 0 to about 9. A more preferred range is from about 2 to about 6 and most preferably from about 4 to about 5.

Preferably, the mole ratio of water vapor to base vapor ranges from about 1:3 to about 1:100, preferably from about 1:5 to about 1:50, and more preferably from about 1:10 to about 1:30.

The water vapor causes a continued hydrolysis of the alkoxysilane alkoxy groups, and the base catalyzes condensation of the hydrolyzed alkoxysilane and serves to increase molecular weight until the coating gels and ultimately increases gel strength. The film is then dried in a conventional way by solvent evaporation of the less volatile solvent. Elevated temperatures may be employed to dry the coating in this step. Such temperatures may range from about 20° C. to about 450° C., preferably from about 50° C. to about 350° C. and more preferably from about 175° C. to about 320° C.

Optionally, additional process steps may be applied to the formed nanoporous silica dielectric film, including, for example, a solvent rinse, a surface modification to enhance hydrophobicity, and any other art-known process steps as required.

After the desired time of reaction after base addition, on the order of seconds to a few minutes, the chamber pressure is brought to atmospheric pressure. This can be accomplished by either adding an inert gas such as nitrogen and opening the chamber or evacuating the base/water mixture via vacuum and backfilling with an inert gas, or even optionally venting the chamber with a non-inert gas, such as air.

Thus, a precursor is deposited on a wafer and the more volatile solvent continues to evaporate over a period of seconds. The wafer is placed in a sealed chamber at ambient pressure. The chamber is opened to a vacuum source and the ambient gas is evacuated and the chamber pressure decreases well below the partial pressure of water vapor. In the next step, water vapor is added and the chamber pressure increases. The pressure increase during that step is the water partial pressure ($P_{H2O}$). The base vapor, in this case ammonia, is introduced into the chamber and polymerization is triggered. The pressure increase during this step is the base partial pressure (for example, $P_{NH3}$), so that the total pressure in the chamber at the end of the ammonia addition cycle is the sum of the partial pressures of water vapor and ammonia. After the desired time, the chamber pressure may be raised to ambient by filling with an inert gas, such as nitrogen as shown, or it may be first evacuated to vacuum and subsequently backfilled to ambient pressure.

As a result, a relatively high porosity, low dielectric constant, silicon containing polymer composition forms on the substrate surface. The silicon containing polymer composition preferably has a dielectric constant of from about 1.1 to about 3.5, more preferably from about 1.3 to about 3.0, and most preferably from about 1.5 to about 2.5. The pore size of silica composition ranges from about 1 nm to about 100 nm, more preferably from about 2 nm to about 30 nm, and most preferably from about 3 nm to about 20 nm. The density of the silicon containing composition, including the pores, ranges from about 0.1 to about 1.9 g/cm$^2$, more preferably from about 0.25 to about 1.6 g/cm$^2$, and most preferably from about 0.4 to about 1.2 g/cm$^2$.

B. Methods of Producing Dielectric Film By Applying Base Material Mixed in Mid-Stream In another preferred embodiment, the nanoporous silica dielectric film is prepared by coating a substrate with a silicon-based precursor composition that is pre-mixed by combining multiple streams of free-flowing component precursor reagents before the composition is applied to a substrate. In this embodiment, a nanoporous silica dielectric film is formed on a substrate by (i) combining a stream of a silicon-based precursor or base material, such as, for example, an alkoxysilane composition, with a stream of a base containing catalyst composition to form a combined composition stream; immediately depositing the combined composition stream onto a surface of a substrate and exposing the combined composition to water (in either order or simultaneously); and planarizing the film during the curing of the combined composition; or (ii) combining a stream of a silicon-based precursor or base material, such as, for example, an alkoxysilane composition, with a stream of water to form a combined composition stream; immediately depositing the combined composition stream onto a surface of a substrate; and planarizing the film during the curing of the combined composition.

Methods (i) and (ii) are described in detail, absent the planarization features of the present invention, in co-owned U.S. application Ser. No. 09/140,855, filed on Aug. 27, 1998, the disclosure of which is incorporated by reference herein in its entirety. Processes for the preparation of nanoporous dielectric silica films by mixing streams of components is summarized in greater detail, as follows. Modifications to methods described in U.S. application Ser. No. 09/140,855 are those optionally required by the need for contacting the film material with a planarization object.

The first step of this process is to prepare a base material in the form of a mixture of at least one precursor, such as an alkoxysilane, as described for Formula I, supra, and a solvent composition. The mixture is then discharged onto a suitable substrate in the form of a stream. In one preferred embodiment, the stream of alkoxysilane composition is combined with a stream of water to form a combined composition stream immediately prior to contacting the substrate.

In an alternate preferred embodiment, a combined composition stream is formed from a stream of the alkoxysilane composition and a stream of a base (i.e. alkaline) containing catalyst composition, e.g., an amine compound, as described, supra. The combined composition stream is thereafter deposited onto a surface of a substrate. Optionally, the combined composition stream is deposited onto the substrate and is then exposed to the water, in the form of a water vapor atmosphere. Alternatively, the combined composition stream is exposed to the water before deposition onto the substrate. In yet another option, the combined composition stream is simultaneously exposed to the water and deposited onto the substrate. This may be in the form of a water stream or a water vapor atmosphere. After deposition and water exposure, the combined composition may be cured, aged, or dried before, during or after planarization, to thereby form a nanoporous dielectric coating on the substrate.

Whichever of the above options is selected for conducting the process, the above-described components of the combined stream composition contact each other in the space above the surface of the substrate, immediately prior to deposition. At a point of confluence of the individual streams, the combined stream is unbounded by tubing, piping, manifolds or the like. This minimizes reaction time between the components prior to deposition and prevents reaction within the intersection point of supply tubes.

Preferably, the components are all in a liquid form and any suitable apparatus for distributing the liquid components may be used for depositing the above-described combined streams of, e.g., alkoxysilane, water and base compositions according to the present invention. Suitable apparatus includes, for example, syringe pumps, but the artisan will appreciate that other devices may be used to form the combined composition stream. Such nonexclusively include faucets, sprayers, hoses, tanks, pipes, tubes, and the like. Various methods of combining the components may be used, such as dripping, squirting, streaming, spraying, and the like.

Exemplary apparatus for conducting this process includes separate containers, e.g., tanks, for storing separate components until the process begins. Each respective tank has a corresponding separate discharge tube for discharging the respective component to be combined into a single stream, so that the combined stream can be deposited onto a substrate surface. Each component is propelled through its respective discharge tube by, e.g., gravity feed and/or by the action of one or more pumps. The artisan will also appreciate that the apparatus can also provide for propelling one or more component(s) by applying positive gas or air pressure to the corresponding storage tank. The flow through each respective discharge tube is optionally regulated by one or more flow control valves located between the distal end of each discharge tube and its respective tank and/or by control of the pumping action, when pumps are employed to propel flow of components. If the components are propelled by air or gas pressure, component flow can also be regulated, in whole or in part, by controlling the pressure of the air or gas propellant.

The discharge tubes are positioned so that each of the respective discharge streams combine together to form a combined composition stream, which is deposited onto a surface of a substrate positioned to received the combined composition stream. Optionally, each discharge tube may also include a shaped nozzle, e.g., a spinner nozzle, or a nozzle formed of one or more openings, e.g., analogous to a showerhead, suitable for forming a discharge stream that mixes well with other such streams. The artisan will appreciate that the dimensions of any provided nozzle, and/or the discharge end of each discharge tube, can be readily modified to assist in regulating pressure and flow rate for each stream, to assure optimal stream contact, mixing, and spreading of the resulting mixed composition stream over the substrate, depending, for example, upon the rate at which the process is conducted, the reaction speed, and the viscosity of the respective component.

A variety of processes may be employed by this method to form a nanoporous dielectric film on a substrate. For a two-component process the components can be, for example, alkoxysilane composition and water, each stored in a separate tank until needed, or alternatively, a base containing catalyst composition in place of the water component.

For a three-component process, the apparatus can have three separate tanks each with a corresponding discharge tube for discharging one of three components, e.g., an alkoxysilane composition, a base containing catalyst composition, and water, respectively. Additional storage tanks and discharge tubes can be added, if required to deliver additional component(s) for the selected process.

The above-described apparatus can also be modified so that a combined stream is deposited onto a substrate in a closed environment which holds at least one additional component in vapor form. For example, when the combined stream is formed of alkoxysilane and base catalyst, the combined stream can be deposited on a substrate positioned in a closed environment that includes a water vapor atmosphere. The closed environment can be formed by any suitable chamber or enclosure able to contain the substrate and vapor component(s). The enclosure will have an inlet or inlets for the component discharge tubes. Preferably, the enclosure portion of the apparatus will also include an additional inlet, with an optional valve, to admit a vapor, a gas-vapor mixture or optionally a liquid to be converted to vapor within the enclosure.

For example, with a two-component combined stream as described above, the apparatus will be constructed as broadly described above, with the additional components of a source of water vapor, e.g., an evaporation bottle or chamber, the evaporation bottle preferably including a heat source for promoting water vaporization and optionally a source of flowing air or inert gas to carry the water vapor into the enclosure. With the enclosure of the substrate, this apparatus operates to expose the combined composition stream to water either during or after deposition onto a surface of the enclosed substrate. The enclosure will also optionally include outlets to allow for venting and/or recycling of the unreacted water vapor and/or other unreacted components.

Useful alkoxysilanes include those defined as for Formula I, supra. Also as defined supra, preferred alkoxysilanes nonexclusively include tetraethoxysilane (TEOS) and tetramethoxysilane.

The solvent composition for the base component, e.g., an alkoxysilane, preferably comprises a relatively high volatility solvent or a relatively low volatility solvent or both a relatively high volatility solvent and a relatively low volatility solvent. The solvent, usually the higher volatility solvent, is at least partially evaporated immediately after deposition onto the substrate. This partial drying leads to better planarity, even absent the additional planarization steps of the instant invention, due to the lower viscosity of the material after the first solvent or parts of the solvent comes off. The more volatile solvent evaporates over a period of seconds or minutes. Slightly elevated temperatures may optionally be employed to accelerate this step. Such temperatures preferably range from about 20° C. to about 80° C., more preferably from about 20° C. to about 50° C. and most preferably from about 20° C. to about 35° C.

The meaning of the expressions, "a relatively high volatility solvent" and "a relatively low volatility solvent composition" is as defined in Section A, supra.

The alkoxysilane component is preferably present in an amount of from about 3% to about 50% by weight of the overall blend, more preferably from about 5% to about 45% and most preferably from about 10% to about 40%.

The solvent component of the alkoxysilane precursor composition is preferably present in an amount of from about 20% to about 90% by weight of the overall blend, more preferably from about 30% to about 70% and most preferably from about 40% to about 60%. When both a high and a low volatility solvent are present, the high volatility solvent component is preferably present in an amount of from about 20% to about 90% by weight of the overall blend, more preferably from about 30% to about 70% and a most preferably from about 40% to about 60% by weight of the overall blend. When both a high and a low volatility solvent are present, the low volatility solvent component is preferably present in an amount of from about 1 to about 40% by weight of the overall blend, more preferably from about 3% to about 30% and a most preferably from about 5% to about 20% by weight of the overall blend.

Typical substrates are those suitable to be processed into an integrated circuit or other microelectronic device as described in detail, supra.

The base containing catalyst composition contains a base, or a base plus water, or a base plus an organic solvent, or a base plus both water and an organic solvent. The base is present in a catalytic amount which can be readily determined by those skilled in the art. Preferably the molar ratio of base to silane ranges from about 0 to about 0.2, more preferably from about 0.001 to about 0.05, and most preferably from about 0.005 to about 0.02. Water is included to provide a medium for hydrolyzing the alkoxysilane. The mole ratio of water to silane is preferably from about 0 to about 50, more preferably from about 0.1 to about 10 and a most preferably from about 0.5 to about 1.5. Suitable solvents for the base containing catalyst composition include those listed above as a high volatility solvent. Most preferred solvents are alcohols such as ethanol and isopropanol.

The temperature of the water during the exposure preferably ranges from about 10° C. to about 60° C., more preferably from about 15° C. to about 50° C., and most preferably from about 20° C. to about 40° C. The temperature of the base during the exposure preferably ranges from about 110° C. to about 60° C., more preferably from about 15° C. to about 40° C., and most preferably from about 20° C. to about 30° C.

Suitable bases nonexclusively include ammonia and amines, such as primary, secondary and tertiary alkyl amines, aryl amines, alcohol amines and mixtures thereof which have a preferred boiling point of at least about −50° C., more preferably at least about 50° C., and most preferably at least about 150° C. Suitable amines, in addition to those recited supra, also include, alcoholamines, alkylamines, methylamine, dimethylamine, trimethylamine, n-butylamine, n-propylamine, tetramethyl ammonium hydroxide, piperidine, 2-methoxyethylamine, mono-, di- or triethanolamines, and mono-, di-, or triisopropanolamines.

The combined composition may be cured, aged, or dried in a conventional way such as solvent evaporation of the less volatile solvent. Elevated temperatures may be employed to cure, age or dry the coating. Such temperatures preferably range from about 20° C. to about 450° C., more preferably from about 50° C. to about 350° C. and most preferably from about 175° C. to about 320° C.

As a result, a relatively high porosity, low dielectric constant silicon containing polymer composition is formed on the substrate. The silicon containing polymer composition preferably has a dielectric constant of from about 1.1 to about 3.5, more preferably from about 1.3 to about 3.0, and most preferably from about 1.5 to about 2.5. The pore size of silica composition preferably ranges from about 1 nm to about 100 nm, more preferably from about 2 nm to about 30 nm, and most preferably from about 3 nm to about 20 nm. The density of the silicon containing composition, including the pores, preferably ranges from about 0.1 to about 1.9 g/cm$^2$, more preferably from about 0.25 to about 1.6 g/cm$^2$, and most preferably from about 0.4 to about 1.2 g/cm$^2$.

C. Variations on Film Forming Processes

Variations on and modifications to the above-described processes for fabricating a nanoporous silica dielectric film have been described in a number of co-owned U.S. patent applications and may optionally be utilized in the practice of the instant invention.

For example, the above-described methods may be modified by producing a film with at least two-different regions of density, i.e., adjacent regions of relatively high and relatively lower density. This is accomplished by blending at least one alkoxysilane with a relatively high volatility solvent composition, a relatively low volatility solvent composition and optional water, thus forming a mixture, and causing a partial hydrolysis and partial condensation of the alkoxysilane; depositing the mixture onto a suitable substrate, while evaporating at least a portion of the relatively high volatility solvent composition; exposing the mixture to a water vapor and a base vapor; and evaporating the relatively low volatility solvent composition. Optionally, the mixture of alkoxysilane and solvents can include catalytic amounts of an acid to produce a pH of, e.g., about 2 to about 5. Further details are disclosed by co-owned U.S. application Ser. Nos. 09/046,473 and 09/046,475, both filed on Mar. 25, 1998, the disclosures of which are incorporated by reference herein in their entireties.

In a second variation, water and base vapor mixing efficiencies are improved by blending at least one alkoxysilane with a solvent composition and optional water and applying the blend to a semiconductor substrate. The substrate is then placed in a sealed chamber that is then evacuated to a pressure below atmospheric pressure. The substrate is then sequentially exposed to water vapor and a base vapor, in either order, at a pressure below atmospheric pressure. Further details are disclosed by U.S. co-owned Ser. No. 09/054,262, filed on Apr. 3, 1998, the disclosure of which is incorporated by reference herein in its entirety.

In a third variation, precursors of an alkoxysilane are employed to form nanoporous dielectric films on a substrate. The dielectric films is formed by applying a precursor mixture to a substrate. The precursor mixture is formed of the following components: a relatively low volatility solvent composition that includes a $C_1$ to $C_4$ alkylether of a $C_1$ to $C_4$ alkylene glycol which is miscible in water and alkoxysilanes. The low volatility solvent composition also has relatively low hydroxyl concentration (e.g, of 0.0084 mole/cm$^3$ or less, or 0.021 mole/cm$^3$, or less), a boiling point of about 175° C. or more at atmospheric pressure, and an average molecular weight ranging from about 100 to about 120, or more. The precursor mixture also includes a relatively high volatility solvent composition having a boiling point below that of the relatively low volatility solvent composition; optional water and an optional catalytic amount of an acid. Further details are provided by co-owned U.S. application Ser. Nos. 09/111,081, 09/111,082, both filed on Jul. 7, 1998, the disclosures of which are incorporated by reference herein in their entireties.

In a fourth variation, precursors of an alkoxysilane are employed to form nanoporous dielectric films on a substrate by vapor deposition, employing silica precursors suitable for vapor deposition as defined above, by Formula I and the associated enumeration of preferred silica species. The silica precursor, with an optional co-solvent, is deposited on a substrate from the vapor phase to form a liquid-like film. Polymerization/gelation are initiated, e.g., generally as previously described, followed by drying the polymerized nanoporous dielectric film. Further details are provided by co-owned U.S. application Ser. No. 09/111,083, filed on Jul. 7, 1998, the disclosure of which is incorporated by reference herein in its entirety.

In a fifth variation, a uniform nanoporous dielectric film can be formed on a horizontally positioned flat substrate centered and held within a cup having an open top section and a removable cover for closing the top. A liquid alkoxysilane composition is deposited onto the substrate surface; covering the cup such that the substrate is enclosed therein; spinning the covered cup and spreading the alkoxysilane composition evenly on the substrate surface. The alkoxysilane composition is then exposed to water vapor and base vapor, injected, e.g., through a vapor injection port that extends through the center of the cover. Contact with the injected vapor(s) forms a gel which is then cured. Further details are provided by co-owned U.S. application serial No. 60/095,573, filed on Aug. 6, 1998, the disclosure of which is incorporated by reference herein in its entirety.

In a sixth variation, nanoporous silica dielectric coatings are formed on a substrate via partial evaporation of a relatively low volatility solvent. A precursor composition is formed from an alkoxysilane, an acid, and a solvent composition containing a high volatility and low volatility solvent. The precursor composition is optionally combined with base catalyst and/or water prior to or after depositing the precursor composition onto a substrate. The relatively high volatility solvent is evaporated, and the low volatility solvent is partially evaporated from the precursor composition. Further details are provided by co-owned U.S. application Ser. No. 09/234,609, filed on Jan. 21, 1999, the disclosure of which is incorporated by reference herein in its entirety.

In a seventh variation, a suitable substrate that includes a dielectric film is treated in a substantially oxygen free environment by heating the substrate to a temperature of about 350° C. or greater, for a time period of at least about 30 seconds. Further details are provided by co-owned U.S.

application serial No. 60/098,515, filed on Aug. 31, 1998, the disclosure of which is incorporated by reference herein in its entirety.

In an eighth variation, a substantially uniform alkoxysilane gel composition is formed on a surface of a substrate. The alkoxysilane gel composition includes a combination of at least one alkoxysilane, an organic solvent composition, water, and an optional base catalyst. The substrate is heated for a sufficient time and at a sufficient temperature in an organic solvent vapor atmosphere to condense the gel composition; and then the gel composition is cured to form a nanoporous dielectric coating having high mechanical strength, on the substrate. Further details are provided by co-owned U.S. application Ser. No. 09/141,287, filed on Aug. 27, 1998, the disclosure of which is incorporated by reference herein in its entirety.

In a ninth variation, nanoporous silica dielectric coatings are formed on a substrate via chemical vapor deposition. Simply by way of example, at least one alkoxysilane composition is vaporized and the vaporized alkoxysilane composition is deposited onto a substrate. The deposited precursor is then exposed to a gelling agent, e.g., water vapor, and either an acid or a base vapor; and dried to form a relatively high porosity, low dielectric constant, silicon containing polymer composition on the substrate. Further details are provided by co-owned U.S. application Ser. No. 09/111,083, filed on Jul. 7, 1998, the disclosure of which is incorporated by reference herein in its entirety.

D. Surface Modification Reagents and Methods

Typically, the silica-based materials, such as the alkoxysiloxanes mentioned herein, form nanoporous films with surfaces, including surfaces of the pore structures, that contain silanol groups. Silanols and the water that they can adsorb from the air are highly polarizable in an electric field, and thus will raise the dielectric constant of the film. To make nanoporous films substantially free of silanols and water, an organic reagent, i.e., a surface modification agent, such as hexamethyldisilazane or methyltriacetoxysilane, is optionally introduced into the pores of the film. Such silylation reagent react with silanols on the pore surfaces to add organic, hydrophobic capping groups, e.g., trimethylsilyl groups. Thus, it has been found desirable to conduct additional processing steps to silylate free surface silanol groups, or to employ multifunctional base materials, as described supra, which do not produce such surface silanol groups.

A number of surface modification agents and methods for producing hydrophobic, low dielectric nanoporous silica films have been described, for example, in co-owned U.S. application Ser. Nos. 60/098,068 and 09/140,855, both filed on Aug. 27, 1998, 09/234,609 and 09/235,186, both filed on Jan. 21, 1999, the disclosures of which are incorporated by reference herein in their entirety.

One preferred surface modification agent is a compound having a formula selected from the group consisting of Formulas IV (1)–(7):
(1) $R_3SiNHSiR_3$, (2) $R_xSiCl_y$, (3) $R_xSi(OH)_y$, (4) $R_3SiOSiR_3$,
(5) $R_xSi(OR)_y$, (6) $M_pSi(OH)_{[4-p]}$, and/or (7) $R_xSi(OCOCH_3)_y$
and combinations thereof, wherein x is an integer ranging from 1 to 3, y is an integer ranging from 1 to 3 such that y=4−x, p is an integer ranging from 2 to 3; each R is an independently selected from hydrogen and a hydrophobic organic moiety; each M is an independently selected hydrophobic organic moiety; and R and M can be the same or different. The R and M groups are preferably independently selected from the group of organic moieties consisting of alkyl, aryl and combinations thereof. The alkyl moiety is substituted or unsubstituted and is selected from the group consisting of straight alkyl, branched alkyl, cyclic alkyl and combinations thereof, and wherein said alkyl moiety ranges in size from $C_1$ to about $C_{18}$. The aryl moiety is substituted or unsubstituted and ranges in size from $C_5$ to about $C_{18}$. Preferably the surface modification agent is selected from the group consisting of acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene-4-one, n-(trimethylsilyl)acetamide, 2-(trimethylsilyl) acetic acid, n-(trimethylsilyl)imidazole, trimethylsilylpropiolate, trimethylsilyl(trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol and combinations thereof. Most preferably the surface modification agent is hexamethyldisilazane. The surface modification agent may be mixed with a suitable solvent such as acetone, applied to the nanoporous silica surface in the form of a vapor or liquid, and then dried.

Additional surface modification agents include multifunctional surface modification agents as described in detail in co-owned U.S. Ser. No. 09/235,186, incorporated by reference herein in its entirety, as described above. Such multifunctional surface modification agents can be applied in either vapor or liquid form, optionally with or without co-solvents. Suitable co-solvents include, e.g., ketones, such as acetone, diisolpropylketon, and others, as described in detail in co-owned U.S. application Ser. No. 09/111,084, filed on Jul. 7, 1998, the disclosure of which in incorporated by reference herein in its entirety. For example, as described in detail in U.S. Ser. No. 09/235,186, as incorporated by reference above, certain preferred surface modification agents will have two or more functional groups and react with surface silanol functional groups while minimizing mass present outside the structural framework of the film, and include, e.g., suitable silanols such as $$R_1Si(OR_2)_3 \qquad \text{Formula V}$$

wherein $R_1$ and $R_2$ are independently selected moieties, such as H and/or an organic moiety such as an alkyl, aryl or derivatives of these. When $R_1$ or $R_2$ is an alkyl, the alkyl moiety is optionally substituted or unsubstituted, and may be straight, branched or cyclic, and preferably ranges in size from $C_1$ to about $C_{18}$, or greater, and more preferably from $C_1$ to about $C_8$. When $R_1$ or $R_2$ is aryl, the aryl moiety preferably consists of a single aromatic ring that is optionally substituted or unsubstituted, and ranges in size from $C_5$ to about $C_{18}$, or greater, and more preferably from $C_5$ to about $C_8$. In a further option, the aryl moiety is not a heteroaryl.

Thus, $R_1$ or $R_2$ are independently selected from H, methyl, ethyl, propyl, phenyl, and/or derivatives thereof, provided that at least one of $R_1$ or $R_2$ is organic. In one embodiment, both $R_1$ and $R_2$ are methyl, and a trifunctional surface modification agent according to Formula V is methyltrimethoxysilane.

In another embodiment, a suitable silane according to the invention has the general formula of $$R_1Si(NR_2R_3)_3 \qquad \text{Formula VI}$$

Wherein $R_1$, $R_2$, $R_3$ are independently H, alkyl and/or aryl. When any of $R_1$, $R_2$, $R_3$ are alkyl and/or aryl, they are defined as for Formula V, above. In preferred embodiments according to Formula VI, $R_1$ is selected from H, $CH_3$, $C_6H_5$, and $R_2$ and $R_3$ are both $CH_3$. Thus trifunctional surface modification agents according to Formula VI include, e.g., tris(dimethylamino)methylsilane, tris(dimethylamino) phenylsilane, and/or tris(dimethylamino)silane.

In yet another embodiment, a suitable silane according to the invention has the general formula of $$R_1Si(ON\!=\!CR_2R_3)_3 \qquad \text{Formula VII}$$

wherein $R_1$, $R_2$, $R_3$ are independently H, alkyl and/or aryl. When any of $R_1$, $R_2$, $R_3$ are alkyl and/or aryl, they are defined as for Formula VII, above. In one preferred embodiment, $R_1$ and $R_2$ are both $CH_3$, and $R_3$ is $CH_2CH_3$. Thus trifunctional surface modification agents according to Formula VII include, e.g., methyltris(methylethylkeoxime) silane.

In yet a further embodiment, a suitable silane according to the invention has the general formula of $$R_1SiCl_3 \qquad \text{Formula VIII}$$

wherein $R_1$ is H, alkyl or aryl. When $R_1$ is alkyl and/or aryl, they are defined as for Formula IV, above. In one preferred embodiment, $R_1$ is $CH_3$. Thus trifunctional surface modification agents according to Formula VIII include, e.g., methyltrichlorosilane.

In a more preferred embodiment, the capping reagent includes one or more organoacetoxysilanes which have the following general formula, $$(R_1)Si(OCOR_2)_y \qquad \text{Formula IX}$$

Preferably, x is an integer ranging in value from 1 to 2, and x and y can be the same or different and y is an integer ranging from about 2 to about 3, or greater.

Useful organoacetoxysilanes, including multifunctional alkylacetoxysilane and/or arylacetoxysilane compounds, include, simply by way of example and without limitation, methyltriacetoxysilane ("MTAS"), dimethyldiacetoxysilane (DMDAS), phenyltriacetoxysilane and diphenyldiacetoxysilane and combinations thereof.

In an alternative embodiment, surface modification is provided by annealing the film with an electron beam. After a base material is deposited on a substrate, and optionally heated to evaporate solvents, the deposited composition is then annealed by exposure to electron beam radiation, in vacuo, at a temperature ranging from about 25° C. to about 1050° C., with a beam energy ranging from about 0.5 to about 30 KeV and an energy dose ranging from about 500 to about 100,000 $\mu C/cm^2$, respectively. The resulting films have essentially no or a reduced amount of carbon and hydrogen after the electron beam process. With methyl groups driven out of the nanoporous silica film, the hydrophobic and polarizable trimethylsilanols are reduced or not present. Further details are provided by co-owned U.S. application Ser. No. 09/227,734, filed on filed on Jan. 9, 1999.

E. Contact Planarization Methods

Broadly, production of planarized nanoporous dielectric silica film coatings on substrates can be conducted by applying a prepared liquid or vapor composition, that includes a suitable silicon-based dielectric precursor, to a substrate, and then completing formation of the desired nanoporous silica dielectric film, by methods modified to include contact with a planarization object, as follows.

(a) Increasing the coating viscosity by aging, i.e., gelling, by means of a pre-added non-volatile acid or base catalyst and/or water, or by contacting the coating with an acid or base catalyst and/or water after application to the substrate.

(b) Contacting the coating with an i.e., a planarization object, having at least one contact surface able to impart the desired degree of planarity, with sufficient pressure to transfer a planar impression to the coating without substantially impairing formation of nanoporous structure.

(c) Separating the planarized coating from the planarizing object.

(d) Curing the surface to hardness.

It will be appreciated that these steps can be readily conducted in the order listed above or in a different order, as illustrated by Table 1.

TABLE 1

| Order of Steps (after coating substrate) | Description |
|---|---|
| (a), (b), (c) and (d) | Age; contact planarization object; separate from object; and then cure. |
| (a), (d), (b) and (c) | Age; cure; contact planarization object; and then separate from object. |
| (b), (a), (d) and (c) | Contact planarization object; allow aging to continue; cure; separate from object. (with application of e.g., S.O.G. composition pre-mixed/treated with gelling agent and, curing in the press). |
| (b), (c), (a) and (d) | Contact planarization object; separate from object; allow aging to continue; cure (with application of e.g., S.O.G. composition pre-mixed or pre-treated with gelling agent). |

In one option, a fluid that includes a silicon-based dielectric precursor also includes viscosity enhancers to permit contact with a planarization object and/or a removable, non-stick film, before significant viscosity enhancement by the aging process has taken place.

In another option, a protective liner and/or additional protective coating, e.g., is applied onto the substrate surface, prior to application of the silica dielectric precursor(s). The substrate can be any potential or partially fabricated semiconductor device, or other type of device, as described supra.

At an appropriate processing stage after the substrate is coated, while the coating remains plastic and able to be impressed with a flat surface while retaining the capacity to form a desired nanoporous structure, the coated substrate is transferred to a press machine, a roller machine, and/or any other art-known device for impressing a flat surface onto the film-coated substrate. There, a planarization object, i.e., an object having at least one surface having the necessary capacity to impress a planar surface on the coating, such as an optical flat, is contacted, preferably under pressure, with the coating on the substrate.

Preferably, as mentioned supra, a release layer, such as a non-stick fluorocarbon surface or other art-known material of similar properties, is positioned between the planarization object contact surface and the coating to be planarized. For convenience, the non-stick release material can be a non-stick film that can be separately applied and separately removed from the planar object contact surface and the planarized coating. In addition, if the substrate is only being coated on one side at a time, a protective layer of a soft material is placed under the other side of the substrate to protect it from damage.

It will also be appreciated that the pressure and duration of the planarization step will vary, depending on the properties of the dielectric coating, including the type of precursor material, viscosity of the coating, coating thickness and the degree of aging and/or curing, if any, that has taken place at the start of the pressing.

In a preferred aspect of the invention, the applied pressure ranges from about 0.1 MPa to about 1 GPa. More preferably, the applied pressure ranges from about 0.2 MPa to about 10 MPa (pressure units in Pascals). The duration of the pressing step preferably ranges from about 10 sec to about 30 minutes, and more preferably, from about 30 sec to about 10 minutes.

In a further aspect of the invention, the coating to be planarized can be exposed to vacuum prior to pressing to speed removal of vapors and/or dissolved gases in order to minimize undesirable bubble formation. Alternatively, the pressing step can be conducted in vacuum. Optionally, the film can be heated and cured while still under pressure in the press or after removal from the press.

The following nonlimiting examples serve to illustrate the invention.

EXAMPLE 1

This example illustrates a process wherein a precursor is mixed with an aging agent, the mixture was then spin deposited onto a surface of a silicon wafer having a pattern of metal wiring on that surface. The coated wafer was then placed in a press with an optical flat having a release layer in contact with the coating.

The base materials, including a dielectric precursor and an aging agent, were mixed for 30 sec before the substrate was spin coated onto test wafers of 4 and 6 inches in diameter. The films were spun on a Solitec™ machine (Solitec Wafer Processing, Inc., San Jose, Calif.) using manual dispense with a spin speed that ranged from 1000 to 4000 rpm. The precursor was a partially hydrolyzed and partially condensed fluid alkoxysilane composition (available from AlliedSignal Corp., Advanced Microelectronic Materials Sunnyvale, Calif. as Nanoglass® K2.2), prepared with 21.6% EtOH mixed with 8.75% monoethanolamine ("MEA") in EtOH. MEA is a nonvolatile base aging agent. The ratio of precursor to the base ranges from about 1:0.34 to about 1:0.26. The Process can be Summarized as Follows:
1) mix Nanoglass precursor with MEA (defined as time 0).
2) deposit and spin film onto silicon wafer.
3) put wafer into press and apply Teflon™ sheet (90 to 210s after time 0).
4) leave in press for 10 min.
5) return to spin coater, perform solvent exchange using HMDZ/3-pentanone, spin dry.
6) hot plate bake at 175° C. and 320° C. for 1 min each.
7) furnace cure at 400° C. for 30 min.

After mixing (time zero), a flat Teflon™ sheet was applied onto the coated wafer, and the combination was put into a press for a time period ranging from about 90 to about 210 secs after the base material was mixed. The press was set at a pressure ranging from about 25 to about 60 psi. The pressed substrates were removed from the press and solvent exchanged using HMDZ/3-pentanone, and then baked at 175° C. and cured at 400° C.

EXAMPLE 2

This example illustrates a process wherein a precursor is spin deposited onto a silicon wafer, the wafer is then aged in a chamber for a given period, planarized by pressing the aged (i.e., gelled) nanoporous silica dielectric film against a flat Teflon™ sheet in a press, and then dried.

The aging process in the chamber is as follows. The chamber is evacuated, dosed with water vapor to various pressures for a fixed amount of time, dosed with ammonia gas to a higher pressure for a fixed amount of time, evacuated once again for a fixed time, then the pressure in the chamber is brought to ambient by backfilling with an inert gas. A precursor is made by mixing, while stirring, 61 ml tetraethyoxysilane, 61 ml tetraethylene glycol, 4.87 ml deionized water, and 0.2 ml 1M nitric acid (Conc. $HNO_3$ diluted to 1M. This mixture was then refluxed while stirring continuously for 1.5 hours, then cooled. A portion of this precursor is diluted 55% by weight with ethanol while stirring.

Approximately 1.5 ml of this diluted precursor is deposited onto a 4 inch silicon wafer on a spin chuck, and spun on at 2500 rpm for 10 seconds. Two films are deposited in this way. Each film is placed into an aging chamber, which is then evacuated to 1 mbar (0.76 torr) in 30 seconds. Water vapor is dosed into the chamber at a pressure ranging from about 7 mbar (5.32 torr) to about 14 mbar (10.64 torr) (from a reservoir of deionized water at temperatures ranging from 0° C. to about 25° C., respectively); the wafers are left in this pressure range of water vapor for 30 seconds.

Ammonia gas is dosed into the chamber to a pressure ranging from about 855 mbar (649.8 torr) to about 809 mbar (614.84 torr); the wafers are left for 1 minute at this pressure range. The chamber is evacuated for 30 seconds to 2 mbar (1.52 torr), then immediately backfilled with air to ambient pressure.

The wafers are removed from the chamber, a flat Teflon™ sheet is applied onto each coated wafer, and the Teflon™ sheeted wafers are put into a press for a time period ranging from about 90 to about 210 secs. The press is set at a pressure ranging from about 25 to about 60 psi. The pressed substrates are removed from the press and placed on a hotplate at 90° C. for 2 minutes, followed by an oven bake at 175° C. for 3 minutes, then another oven bake at 400° C. for 3 minutes. The wafers are removed from the press, and after cooling are measured by ellipsometry for thickness and refractive index. Refractive index can be linearly correlated to the film porosity. A refractive index of 1.0 is 100% porosity and 1.46 is dense, 0% porosity silica. The wafers are also inspected by scanning electron microscopy for surface planarity and regularity. The results of the measurements of the nanoporous dielectric film confirm that the index of refraction and the thickness are within acceptable limits, and the surfaces of the dielectric films are planar.

EXAMPLE 3

The processes of Example 1 are repeated, except that the wafers are heated and dried before being placed in the press.

EXAMPLE 4

The processes of Example 1 are repeated, except that the wafers are heated at 90° C. for 2 minutes while still in the press by the application of heat to the plates of the press. The wafers are then removed from the press for the final oven back as described by Example 1.

EXAMPLE 5

The processes of Example 1 are repeated, except that the press is set at a pressure ranging from about 10 to about 30 psi.

EXAMPLE 6

This example illustrates a process wherein a precursor is spin deposited onto a silicon wafer, the wafer is then aged in a chamber for a given period and then dried. The aging process in the chamber is as follows. The chamber is evacuated, dosed with water vapor to a fixed pressure for a fixed amount of time, dosed with ammonia gas to various higher pressures for a fixed amount of time, evacuated once again for a fixed time, then the pressure in the chamber is brought to ambient by backfilling with an inert gas. A precursor is made by mixing, while stirring, 61 ml tetraethyoxysilane, 61 ml tetraethylene glycol, 4.87 ml deionized water, and 0.2 ml 1M nitric acid. This mixture is then refluxed while stirring continuously for 1.5 hours, then cooled. A portion of this precursor is diluted 55% by weight with methanol while stirring. Approximately 1.5 ml of this diluted precursor is deposited onto a 4 inch silicon wafer on a spin chuck, and spun on at 2500 rpm for 10 seconds. Three films are deposited in such a way. Each film is placed into an aging chamber, which is evacuated to 1 mbar (0.76 torr) in 30 seconds. Water vapor is dosed into the chamber to 15 mbar (11.4 torr) (from a reservoir of deionized water at 25° C.) and the wafers are left for 30 seconds at this pressure. Ammonia gas is dosed into the chamber to a pressure of 270 mbar (205.2 torr) for the first wafer, 506 mbar (384.56 torr) for the second wafer, and 809 mbar (614.84 torr) for the third. The wafers are left at these pressures for 3 minutes. Next the chamber is evacuated for 30 seconds to 2 mbar (1.52 torr), then immediately backfilled with air back to ambient pressure.

The wafers are removed from the chamber, a flat Teflon™ sheet is applied onto each coated wafer, and the Teflon™ sheeted wafers are put into a press for a time period ranging from about 200 to about 400 secs. The press is set at a pressure ranging from about 40 to about 100 psi. The pressed substrates are removed from the press and placed on a hotplate at 90° C. for 2 minutes, followed by an oven bake at 175° C. for 3 minutes, then another oven bake at 400° C. for 3 minutes. The wafers are then removed and after cooling are measured by ellipsometry for thickness and refractive index. The wafers are also inspected by scanning electron microscopy for surface planarity and regularity. The results of the measurements of the nanoporous dielectric film confirm that the index of refraction and the thickness are within acceptable limits, and the surfaces of the dielectric films are planar.

EXAMPLE 7

This example demonstrates that a catalyzed nanoporous silica precursor deposited via codeposition can be aged in ambient clean room humidity to yield low density uniform thin films that can be readily planarized.

The precursor is synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution is allowed to mix vigorously then heated to ~80° C. and refluxed for 1.5 hours to form a solution. After the solution is allowed to cool, it is diluted 21.6% by weight with ethanol to reduce the viscosity. The catalyst used was monoethanolamine. It is diluted 8.75% by weight in ethanol to reduce viscosity and increase the gel time.

A dual syringe pump is used for deposition. The dual syringes are assembled using a 5 ml and 20 ml syringe, respectively, which are each attached to a fluid delivery tube. The two tubes each terminate so that the fluid streams from each will mix and commingle when the syringes are simultaneously pumped.

The precursor is loaded into the larger syringe and catalyst is loaded into the smaller syringe. 1 ml of precursor and 0.346 ml of catalyst are simultaneously pumped at a rate of 10 ml/min. The fluid streams meet at a 90° angle to form one stream, which in turn flows onto the substrate. The wafer is spun at 2500 rpm for 30 seconds after deposition. The film is placed in a wafer carrier cartridge in the cleanroom ambient humidity that is set at 35%. The film is then aged for 15 min.

The film is then solvent exchanged by depositing 20–30 mL of an aged (36 hrs) 50/50 (by vol.) mixture of acetone, and hexamethyldisilazane (HMDZ) for 20 seconds at 250 rpm without allowing the film to dry. The film is then spun dry at 1000 rpm for 5 seconds.

A flat Teflon™ sheet is applied onto the coated wafer, and the Teflon™ sheeted wafers are put into a press for a time period ranging from about 200 to about 400 secs. The press is set at a pressure ranging from about 40 to about 100 psi. The pressed substrates are removed from the press and then heated at elevated temperatures for 1 min. at 175° C. and 320° C., respectively, in air. The film is characterized by ellipsometry to determine the refractive index and thickness. In addition, the hydrophobicity is tested by placing a water drop onto the film to determine the contact angle. The wafers are also inspected by scanning electron microscopy for surface planarity and regularity. The results of the measurements of the nanoporous dielectric film confirm that the index of refraction and the thickness are within acceptable limits, that the films are substantially hyrophobic, and that the surfaces of the produced dielectric films are planar.

EXAMPLE 8

The processes of Example 7 are repeated, except that the press is set at a pressure ranging from about 10 to about 30 psi.

What is claimed is:

1. A process for forming a substantially planarized nanoporous dielectric silica coating on a substrate comprising: applying a composition that comprises a silicon-based precursor onto a substrate to form a coating on a substrate, and conducting the following steps:

(a) gelling or aging the applied coating;

(b) contacting the coating with a planarization object with sufficient pressure to transfer an impression of the object to the coating without substantially impairing formation of nanometer-scale pore structure, (c) separating the planarized coating from the planarization object, (d) curing said planarized coating;

wherein steps (a)–(d) are conducted in a sequence selected from the group consisting of (a), (b), (c), and (d);

(a), (d), (b), and (c);

(b), (a), (d), and (c);

(b), (a), (c), and (d); and (b), (C), (a), and (d).

2. The process of claim 1 wherein the silicon-based dielectric precursor is selected from the group consisting of an alkoxysilane, alkylalkoxysilane, a silsesquioxane, a hydrogensiloxane, a hydroorganosiloxane, a hydrogensilsesquioxane, an acetoxysilane, a halogenated silane and combinations thereof.

3. The process of claim 2 wherein the alkoxysilane comprises

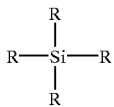

Formula I wherein at least 2 of the R groups are independently $C_1$ to $C_4$ alkoxy groups and the balance, if any, are independently selected from the group consisting of hydrogen, alkyl, phenyl, halogen, and substituted phenyl.

4. The process of claim 3 wherein each R is independently selected from the group consisting of methoxy, ethoxy, propoxy, and butoxy.

5. The process of claim 3 wherein the alkoxysilane is selected from the group consisting of tetraethoxysilane, tetramethoxysilane and a combination thereof.

6. The process of claim 1 wherein the planarization object is an object having a contact surface selected from the group consisting of a flat surface, a curved surface and combinations thereof, wherein when said planarization object has said curved contact surface, said contacting step is conducted so that said curved contact surface is applied to said substrate with a rolling motion.

7. The process of claim 6 wherein the planarization object is an optical flat having a contact surface comprising a layer selected from the group consisting of a non-stick release material, a gas-permeable non-stick release material, a non-stick release material with gas or vapor absorbing properties and combinations thereof.

8. The process of claim 7 wherein the non-stick release material is separately removable from said planar object contact surface and the planarized coating.

9. The process of claim 6 wherein the planarization object is contacted with the coating of step (a) with a force ranging from about 0.1 MPa to about 1 GPa.

10. The process claim 1 wherein said silicon-based precursor composition further comprises an aging promoter or catalyst selected from the group consisting of water, an acid, a base, a combination of water and an acid, and a combination of water and a base.

11. The process of claim 10 wherein steps (a)–(d) are conducted in the sequence of (b), (a), (c) and (d).

12. The process of claim 10 wherein the base is a non-volatile amine selected from the group consisting of primary, secondary and tertiary alkylamines, aryl amines, alcohol amines and mixtures thereof which have a boiling point of about 200° C. or less.

13. The process of claim 1 wherein curing step (d) is conducted by heating the coating while in contact with the planarization object.

14. The process of claim 1 wherein the coating is formed and applied onto the substrate by a combined stream process which comprises performing either (i) or (ii):
  (i) (A) combining a stream of an alkoxysilane composition with a stream of a base containing catalyst composition to form a combined composition stream which is unbounded at a point of confluence; and
  conducting steps (B) and (C) in either order or simultaneously:
  (B) immediately depositing the combined composition stream onto a surface of the substrate;
  (C) exposing the combined composition to water; and
  (ii) (A) combining a stream of an alkoxysilane composition with a stream of water to form a combined composition stream which is unbounded at a point of confluence; and
  (B) immediately depositing the combined composition stream onto a surface of the substrate.

15. The process of claim 1 wherein the coating is applied onto the substrate by a method selected from the group consisting of spin-coating, dip coating, brushing, rolling, spraying, chemical vapor deposition and combinations thereof.

16. The process of claim 1 wherein the curing of step (d) is conducted by steps selected from the group consisting of heating, drying, evaporating and combinations thereof.

17. The process of claim 16 wherein the heating step is conducted at a temperature ranging from about 350° C. to about 600° C. for a time period ranging from about 30 seconds to about 5 minutes.

18. The process claim 1 wherein the silicon-based precursor composition comprises at least one organic solvent.

19. The process of claim 1 wherein the coating is contacted with the planarization object under vacuum.

20. The process of claim 1 wherein the substrate comprises at least one semiconductor material.

21. The process of claim 1 further comprising a step of treating the nanoporous dielectric silica coating with a surface modification agent under conditions sufficient to render the coating hydrophobic.

22. The process of claim 21 wherein the surface modification agent comprises hexamethyldisilazane.

23. The process of claim 1 further comprising a subsequent step of forming an integrated circuit from the planarized nanoporous dielectric silica coating.

24. The process of claim 1 wherein the process steps (a)–(d) are conducted in the order of (b), (a), (c), and (d).

25. The process of claim 1 further comprising a subsequent step of forming an integrated circuit from the patterned dielectric silica coating.

26. The process of claim 1 wherein the planarization object is an object having a flat contact surface.

27. A process for forming a dielectric silica coating on a substrate with a pattern impressed thereon comprising coating a substrate with a composition comprising a precursor for forming a nanoporous dielectric film, contacting said coating with a patterned surface with a pressure and for a time period sufficient in impress the pattern on said coating, and then separating the patterned surface from said coating.

28. The process of claim 27 wherein said coating is aged or gelled while said patterned surface is in contact with said coating.

29. The process of claim 27 wherein said coating is aged or gelled after said patterned surface is removed from contact with said coating.

30. The process of claim 27 wherein said coating is aged or gelled before said patterned surface is contacted with said coating.

31. The process of claim 27 wherein said patterned surface comprises at least one region that is at least 98 percent planar.

32. The process of claim 27 wherein said patterned surface has multiple planar regions.

33. A method of planarizing or patterning a dielectric film on a substrate comprising
  (a) applying a dielectric film precursor to a substrate by chemical vapor deposition;
  (b) planarizing or patterning said dielectric film in an apparatus comprising
    (i) a press for applying contact pressure to a compression tool,
    (ii) a compression tool having a working face that is planar or patterned, wherein said compression tool is operably connected to said press, (iii) a controller for regulating the position, timing and force applied to said dielectric film by said press, (iv) a support positioned adjacent said substrate and opposite from the film to be contacted with the compression tool;

by applying sufficient pressure to transfer an impression of the working face of the compression tool to the coating;

(c) gelling said dielectric film before, during or after step (b);

(d) curing said dielectric film.

34. A method of planarizing or patterning a dielectric film on a substrate comprising (a) applying a dielectric film precursor to a substrate;

(b) planarizing or patterning said dielectric film in an apparatus comprising (i) a press for applying contact pressure to a compression tool, (ii) a compression tool having a working face that is planar or patterned, wherein said compression tool is operably connected to said press, (iii) a controller for regulating the position, timing and force applied to said dielectric film by said press, (iv) a support positioned adjacent said substrate and opposite from the dielectric film to be contacted with the compression tool;

by applying sufficient pressure to transfer an impression of the working face of the compression tool to the coating;

(c) gelling said dielectric film before, during or after step (b);

(d) curing said dielectric film wherein said curing comprises processing by electron beam, ion beam, ultraviolet radiation, or ionizing radiation.

* * * * *